United States Patent [19]

Barzynski et al.

[11] B 4,001,015

[45] Jan. 4, 1977

[54] METHOD FOR THE PRODUCTION OF PRINTING PLATES USING PHOTOSENSITIVE COMPOSITIONS

[75] Inventors: Helmut Barzynski, Lambsheim; Peter Richter, Mannheim, both of Germany

[73] Assignee: Badische Anilin- & Soda-Fabrik Aktiengesellschaft, Ludwigshafen (Rhine), Germany

[22] Filed: Jan. 30, 1974

[21] Appl. No.: 437,894

[44] Published under the second Trial Voluntary Protest Program on March 2, 1976 as document No. B 437,894.

Related U.S. Application Data

[62] Division of Ser. No. 182,873, Sept. 22, 1971, abandoned.

[30] Foreign Application Priority Data

Oct. 9, 1970  Germany ........................ 2049621

[52] U.S. Cl. .................................. 96/33; 96/27 R; 96/115 R; 96/115 P
[51] Int. Cl.$^2$ ...................... G03C 1/70; G03F 7/08

[58] Field of Search .......... 96/115 R, 115 P, 27 R, 96/33

[56] References Cited

UNITED STATES PATENTS

| | | | |
|---|---|---|---|
| 3,036,915 | 5/1962 | Notley | 96/84 |
| 3,740,224 | 6/1973 | Barzynski | 96/33 |

*Primary Examiner*—Ronald H. Smith
*Attorney, Agent, or Firm*—Johnston, Keil, Thompson & Shurtleff

[57] ABSTRACT

Photosensitive compositions based on soluble vinylpyrrolidone polymers, soluble or swellable polycarboxylic acids, photopolymerizable olefinically unsaturated monomers and optional additions of photoinitiators and polymerization inhibitors.

The photosensitive compositions of the invention are suitable for the preparation of printing plates, particularly lithographic plates.

4 Claims, No Drawings

METHOD FOR THE PRODUCTION OF PRINTING PLATES USING PHOTOSENSITIVE COMPOSITIONS

This is a division of application Ser. No. 182,873, filed Sept. 22, 1971, now abandoned.

This invention relates to photosensitive compositions for the production of printing plates by coating a substrate with such compositions and exposing the coated substrate. The invention relates in particular to photosensitive compositions for the preparation of planographic printing plates and to the manufacture of such plates.

Photosensitive compositions for the preparation of lithographic plates for offset printing are known per se.

In offset printing processes, which are preferably used in the art, soluble polymeric compounds are made insoluble by photo-induced crosslinking using for example diazo compounds or chromates. The unexposed areas are then washed out and there is thus obtained a planograhic printing relief. In such processes, the photosensitive film is applied to a water-wettable support. For short runs and prints of not particularly high quality the support used consists of dimensionally stable paper coated with a substance, such as sodium carboxymethylcellulose, for improving its affinity to water. For high-quality prints and a large number of impressions the support is made of metal, preferably zinc, aluminum or chromium, having a roughened and/or etched surface.

The aforementioned processes have a number of disadvantages, for example several operations, such as developing and fixing, are necessary after exposure.

The grained metal surface is extremely sensitive to corrosion and scratches. It is therefore necessary to protect it by applying a coating of, say, sodium carboxymethylcellulose. Another drawback is that, when a halftone negative is used, an irregular shape is imparted to the individual dots by the rough surface of the metal support.

There are at present only a few processes in which a hydrophilic film becomes hydrophobic by exposure to light. One such process called "collotype" reproduces gray shades without the use of a screen. In this process a photosensitive gelatine layer is progressively hardened by incident light. However, since the gelatine layer is of low mechanical strength, printing plates having such a layer can only be used for short-run work. Furthermore, water absorption of the gelatine changes during printing with the result that shifts in the tonal values which are difficult to control may occur.

In a recently disclosed process for the manufacture of printing plates (German Printed Application No. 1,447,977), a hydrophilic layer consisting of a mixture of polyethylene oxide and a phenolic resin, to which an organic sulfonic acid has been added, is rendered hydrophobic by exposure to light in the presence of ammonium bichromate. A disadvantage of this process is that no corrections can be made to the plate once it has been exposed. Another disadvantage is that the exposure times are unsatisfactory.

It is an object of the present invention to provide a suitable composition for the preparation of a photosensitive layer which may be applied in a simple manner to any dimensionally stable support such as wood, paper, metal or plastics material, it being possible to use the coated support as a lithographic plate immediately after exposure without development. It is another object of the present invention to provide a method of manufacturing lithographic plates which have adequate mechanical strength for the production of a relatively large number of impressions of planographic printing techniques. Moreover, the said printing plates should be suitable for exposure through both halftone negatives and continuous tone negatives. They should also be superior to collotype printing plates as regards the maximum possible number of impressions and resistance to shifts in the tonal values during printing.

We have now found that photosensitive compositions based on an intimate blend of A. 40 to 97% by weight, with reference to the whole blend A + B, of a mixture of
  A.1. 15 to 80% by weight, with reference to A, of a water-soluble linear N-vinylpyrrolidone polymer having a molecular weight of at least 1000, and
  A.2. 20 to 85% by weight, with reference to A, of a polycarboxylic acid which is soluble or swellable in water or aqueous alkali and has a molecular weight of at least 500, the content of carboxyl groups therein being at least 5% by weight based on the polymeric polycarboxylic acid, and
B. 3 to 60% by weight, with reference to the whole blend A + B, of olefinically unsaturated monomers which are compatible with mixture A (A 1 + A.2), which do not boil below 100°C at atmospheric pressure, and of which the portion having more than one photopolymerizable olefinically unsaturated double bond predominates, undergo a gradual change in their critical surface tension (for definition see for example "Contact Angle, Wettability and Adhesion" in Advances in Chemistry Series 43, page 12, 1964) during photopolymerization and are outstandingly suitable for the preparation of printing plates, especially lithographic plates. We have also found that such printing plates can be produced quickly and simply by applying a thin layer based on the said photosensitive mixture to dimensionally stable supports and, if necessary, drying for a short period at a temperature of from 60° to 130°C, at which no polymerization takes place in the mixture, and then exposing the layer under a negative or positive which is at least partly transparent, no development being necessary. The gray shades of the image-bearing transparency need not be split up into dots for this process but can be reproduced directly on the printing plate. Another advantage of the present process is that the exposure of the composition for the purpose of producing a printing plate need only be short and generally takes less than 90 seconds. Planographic printing plates produced using the photosensitive compositions of the invention are able, on account of their good mechanical strength, to be used for relatively long runs and exhibit good resistance to shifts in the tonal values during printing. Furthermore, corrections can be made to the finished, i. e. exposed, plates by removing parts of the layer with a suitable solvent such as aqueous or alcoholic sodium hydroxide or potassium hydroxide solutions followed by re-coating and re-exposure. A further advantage of the photosensitive mixtures of the invention is that they adhere well to different types of support.

The composition of the invention is composed of a blend consisting essentially of A. 40 to 97%, particularly 55 to 85%, by weight, with reference to the whole blend A + B, of a mixture of A.1. 15 to 80%, particularly 30 to 60%, by weight, with reference to A, of a water-soluble N-vinylpyrrolidone polymer having a molecular weight of at least 1000, and A.2. 20 to 85%, particularly 40 to 70%, by weight, with reference to A, of a polycarboxylic acid which is soluble or swellable in water or aqueous alkali and has a molecular weight of at least 500, the content of carboxyl groups therein being at least 5%, preferably at least 20%, by weight based on the polymeric polycarboxylic acid, and B. 3 to 60%, particularly 15 to 45%, by weight, with reference to the whole blend A + B, of at least one olefinically unsaturated monomer which is compatible with mixture A (A.1 + A.2), does not boil below 100°C at atmospheric pressure and has more than one photopolymerizable olefinically unsaturated double bond. Mixtures of olefinically unsaturated monomers may also be used, in which case the monomer or monomers having more than one photopolymerizable olefinically unsaturated double bond must predominate.

The mixture of A.1 and A.2 is preferably in the form of an associate.

As water-soluble N-vinylpyrrolidone polymers there may be used, apart from N-vinylpyrrolidone homopolymers, N-vinylpyrrolidone copolymers containing minor quantities, preferably from 5 to 45 mol% based on the total amount of monomers, of other copolymerizable monoolefinically unsaturated monomers such as vinyl acetate, vinyl propionate, vinyl chloride, vinylidene chloride, acrylic esters and/or methacrylic esters of aliphatic alcohols having 1 to 8 carbon atoms, styrene and vinyl alkyl ethers, provided that such copolymers are substantially water-soluble. The use of copolymers having reactive lateral groups such as copolymers with glycidyl acrylate, butadiene-1,2 monoxide, glycidyl allyl ether, vinyl isocyanate, allyl alcohol, N-methylolacrylamide and/or maleic anhydride is also advantageous. The lateral groups in the copolymer may preferably be reacted with compounds containing copolymerizable olefinically unsaturated double bonds such as methacrylic acid, acrylic acid, methacrylic anhydride and/or acrylic anhydride, allyl alcohol and/or acrylamide. As a result, lateral olefinic groups are introduced into the polymer molecule, which facilitates crosslinking of the blend during exposure.

Particularly suitable polycarboxylic acids having a molecular weight of at least 500 and containing at least 5% by weight of —COOH groups are homopolymers and copolymers of homopolymerizable or copolymerizable olefinically unsaturated carboxylic acids having from 3 to 12 carbon atoms, particularly from 3 to 6 carbon atoms. such as acrylic, methacrylic, crotonic, aconitic, citraconic, maleic, fumaric, methyleneglutaric and cinnamic acids and $C_1$ to $C_8$ alkyl half-esters of maleic acid, fumaric acid and the other polycarboxylic acids mentioned above, provided they are soluble or at least swellable in water or aqueous alkali. Polyacrylic acids are preferred. Also very suitable are the copolymers of acrylic acid or methacrylic acid with maleic anhydride, which have been subsequently hydrolyzed or reacted with aliphatic hydroxyl compounds having from 1 to 8 carbon atoms. In one advantageous embodiment, say, from 60 to 80 mol% of acrylic acid is copolymerized with from 20 to 40 mol% of maleic anhydride by for example a conventional precipitation polymerization process. Polycarboxylic acids and in particular copolymers of olefinically unsaturated carboxylic acids having from 3 to 5 carbon atoms, which contain from 5 to 30 mol% of building blocks having lateral photopolymerizable olefinic double bonds have been found to be very suitable. Such polycarboxylic acids may be advantageously prepared for example by reacting copolymers consisting of from 60 to 80 mol% of acrylic or methacrylic acid and from 20 to 40 mol% of maleic anhydride with hydroxyl-containing olefinically unsaturated compounds, such as monoacrylates or monomethacrylates of aliphatic diols having from 2 to 8 carbon atoms, for example ethylene glycol monomethacrylate or 1,4-butanediol monoacrylate, or with allyl alcohol. Polycarboxylic acids of the latter type increase the drop in hydrophily of the mixture during exposure due, probably, to increased crosslinking caused by photopolymerization.

Suitable olefinically unsaturated monomers are preferably monomers having more than one photopolymerizable olefinic double bond. These may be used in admixture with each other or in admixture with minor quantities of monoolefinically unsaturated monomers, but the latter should not generally be present in an amount of more than 30%, preferably not more than 20%, by weight of the total amount of monomers. The monomer or monomer mixture should boil at 100°C or above at atmospheric pressure and should be substantially compatible with the mixture of A.1 with A.2 to enable a stable intimate mixture to be obtained therewith. Very suitable are monomers having a number of olefinically unsaturated double bonds and containing polar groups such as amide, urethane and ester groups, such as the bisacrylamides or bismethacrylamides of diamines having from 2 to 12 carbon atoms, e. g. hexamethylene-1,6-bisacrylamide, butylene-1,4-bismethacrylamide, m-xylylene-bisacrylamide, methylene-bis-(meth)acrylamide, the reaction products (diethers) of 1 mole of an aliphatic diol having from 2 to 8 carbon atoms with 2 moles of N-methylolacrylamide or N-methylolmethacrylamide, e. g. $CH_2$=CH—CO—NH—$CH_2$—O—$CH_2$—$CH_2$—O—$CH_2$—NH—CO—CH=$CH_2$, reaction products of 2 moles of mono(meth)acrylates of aliphatic diols having from 2 to 8 carbon atoms, such as 1,4-butanediol monoacrylate, with 1 mole of a diisocyanate, such as toluylene diisocyanate, i. e. monomers having 2 olefinic double bonds, 2 ester groups and 2 urethane groups in the molecule, di-, tri- and poly-acrylates of polyhydric alcohols or phenols having from 2 to 12 carbon atoms, e. g. trimethylolpropane diacrylate and trimethylolpropane triacrylate, maleic or fumaric half-esters of polyhydric alcohols containing at least two C=C bonds in the monomer molecule, and triallyl cyanurate and 1,3,5-triacryloylperhydrotriazine.

Suitable monoolefinic monomers which are added in small quantities in some cases include acrylamide, methacrylamide, N-methylol(meth)acrylamide and their ethers with alcohols having from 1 to 8 carbon atoms, mono(meth)acrylates of aliphatic diols or polyols having from 2 to 12 carbon atoms, such as 1,4-butanediol monoacrylate and diethyleneglycol monomethacrylate and monoesters of said diols or polyols with maleic acid or fumaric acid, such as triethyleneglycol monomaleate.

It is preferred to add to the blend of A and B a photoinitiator, i. e. a compound which initiates polymerization under the action of light. Suitable photoinitiators of this kind are conventional compounds which decompose with the formation of free radicals under the action of light and thus have a polymerization-initiating action, such as are described by J. Kosar in "Light-Sensitive Systems", J. Wiley and Sons Inc., New York, pages 158 to 193. Examples of suitable photoinitiators are aromatic carbonyl compounds of the benzophenone type, particularly vicinal ketaldonyl compounds such as benzil and diacetyl; α-ketaldonyl alcohols such as benzoyl alcohols; e. g. benzoin; acyloin ethers such as benzoin isopropyl ether and α-methylolbenzoinmethyl ether, β-substituted aromatic acryloins such as α-methylbenzoin, and α-ketocarboxylic acids, such as benzoylformic acid; halogen compounds such as iodoform and triiodoacetic acid; and metal carbonyl compounds, such as cyclopentadienyl molybdenum tricarbonyl and triphenylphosphine iron tetracarbonyl in conjunction with halogen compounds. The photoinitiators are used generally in amounts of 0.01 to 20%, preferably in amounts of from 1 to 15%, by weight based on the blend of A and B.

Suitable polymerization inhibitors are any of the conventional polymerization inhibitors, particularly hydroquinone, p-methoxyphenol, p-quinone, thiourea, copper(I) chloride, methylene blue, β-naphthylamine, sodium N-nitrosocyclohexylhydroxylamine, β-naphthol and phenols. They are used advantageously in amounts of from 0.01 to 1%, preferably in amounts of 0.01 to 0.5%, by weight based on the blend of A and B.

The photosensitive mixtures may also, if desired, contain dyes, e. g. indigoid dyes such as indigo-2,5-disulfonic acid in the form of a dialkali metal salt and/or fillers without the character of the compositions of the invention being substantially changed.

Preparation of the compositions of the invention is preferably carried out by combining the components in dissolved form, suitable solvents being polar organic solvents such as lower alcohols, e. g. methanol, ethanol, propanol and n-butanol, formamide, dimethyl formamide, glacial acetic acid, dioxane, tetrahydrofuran and mixtures thereof.

The printing plates, particularly lithographic plates, are produced by applying the photosensitive compositions, advantageously in the form of solutions, to a dimensionally stable rigid or flexible support of metal, wood, plastics material or paper by a conventional method such as casting, dipping, spraying or centrifuging, the amount of composition applied being such that the layer of photosensitive composition remaining after the solvent or solvent mixture has been evaporated under subatmospheric or atmospheric pressure generally has a thickness of from 0.0004 to 4 mm and preferably from 0.001 to 0.01 mm.

The coated support is advantageously dried, for example in a drying cabinet, for a short period at from 60° to 130°C before it is exposed. The actual drying time and drying temperature used depend on the nature of the composition and may be readily determined for each photosensitive composition by simple experiment. The printing plate is then exposed through an image-bearing transparency in conventional exposure equipment, advantageously for about 0.1 to 10 minutes. The exposure time depends on the concentration of initiator, the concentration of inhibitor, the drying time of the layer and the degree of polymerization of the polycarboxylic acid and the N-vinylpyrrolidone polymer. It may be readily determined by simple experiment.

A printing plate prepared in this way, without further processing, gives a large number of good printed copies using a conventional offset press. The pH of the water used should not exceed 7.

The unexposed blank material is sensitive to light and must therefore be stored in the dark. It is possible, however, to make such material insensitive to light by omitting the photoinitiators from the composition of the invention; this material may then be stored in daylight. Before exposure, the printing plate is sensitized by spraying a solution of a photoinitiator in an organic solvent or water onto it, and exposed after the solvent or water has evaporated.

Particularly suitable lamps for exposing the photosensitive compositions are lamps emitting light of a wavelength of from 300 to 700 mμ, such as xenon lamps, fluorescent tubes, mercury vapor lamps and carbon arc lamps.

The invention is illustrated by the following Examples in which parts and percentages are by weight unless otherwise stated. Parts by weight bear the same relation to parts by volume as the kilogram to the liter.

EXAMPLE 1

72 parts of a polyacrylic acid (molecular weight higher than $10^5$) produced by precipitation polymerization of acrylic acid in benzene, 80 parts of the diether prepared from 1 mole of ethylene glycol and 2 moles of N-methylolacrylamide, 6 parts of benzoin methyl ether and 0.1 part of hydroquinone are dissolved in 3500 parts by volume of dimethyl formamide at 60°C. Small amounts of insolubles are removed by filtration through glass wool. To this solution there is added a solution of 60 parts of a copolymer of 80 mol% N-vinylpyrrolidone and 20 mol% vinyl acetate in 1000 parts by volume of dimethyl formamide. The solution is cast on a steel sheet in such an amount that a clear film having a thickness of 0.001 mm is obtained after evaporation of the solvent. The plate is then dried in a drying cabinet for 12 minutes at 90°C. The plate is exposed for 1 minute through a transparent halftone negative to produce a planographic printing plate which may be used immediately in an offset press and gives prints of good quality.

EXAMPLE 2

5 parts of a commercially available copolymer derived from 70 parts of N-vinylpyrrolidone and 30 parts of vinyl acetate and 0.2 part of sodium hydroxide are dissolved in 100 parts by volume of n-propanol and hydrolyzed for 3 hours at 50°C. The alcohol is then distilled off and the residue is dissolved in 100 parts by volume of tetrahydrofuran.

3 parts of acrylic acid and 0.1 part of potassium peroxide disulfate are dissolved in 50 parts of water and heated at 70°C for 3 hours. The water is then removed in a rotary evaporator and the polyacrylic acid is dissolved in 10 parts by volume of tetrahydrofuran. To this solution there are added 3 parts of triethylene glycol diacrylate, 3 parts of titanium dioxide, 0.5 part of benzoylcarboxylic acid and 0.02 part of methlene blue. The two solutions are combined, and the resulting solution is sprayed onto an aluminum foil in such an amount that a film 0.0005 mm in thickness is produced. Following evaporation of the tetrahydrofuran, the photosensitive aluminum foil is dried at 130°C for 10 minutes. The foil is then exposed through a transparent continuous tone negative for 30 seconds to produce a printing plate which may be used in a small offset press and gives excellent printed copies with no shifts in tonal values.

EXAMPLE 3

500 parts of N-vinylpyrrolidone, 100 parts of vinyl isocyanate and 0.5 part of azodiisobutyronitrile are dissolved in 3000 parts by volume of anhydrous benzene, and the solution is boiled for 4 hours in a stream of nitrogen. The polymer obtained is precipitated by pouring in cyclohexane, filtered and dissolved in 3000 parts of stabilized acrylic acid with the formation of $CO_2$ and while heating. The resulting copolymer of N-vinylpyrrolidone and N-vinylacrylamide is precipitated in cyclohexane, washed with cyclohexane and dried.

200 parts of a copolymer of maleic anhydride and styrene (molar ratio 1 : 1) are stirred with 1000 parts by volume of ethylene glycol monoacrylate at 50°C. The resulting half-ester is precipitated in water and dissolved in 1000 parts by volume of ethanol. To this solution there is added a solution of 300 parts of N-vinylpyrrolidone prepared as described above, 100 parts of 1,1,1-trimethylolpropane triacrylate, 10 parts of cyclopentadienyl iron dicarbonyl, 100 parts of hexachloroxylene and 1 part of thiourea in 2000 parts of ethanol. A strong, dimensionally stable paper is then coated with this solution. Following evaporation of the solvent, the coated paper is pre-exposed for 20 seconds and then immediately exposed for 90 seconds through a transparent halftone negative using a 100-watt incandescent lamp. The resulting lithographic plate may be used immediately and gives prints of excellent quality.

EXAMPLE 4

30 parts of maleic anhydride and 300 parts by volume of benzene are boiled under reflux. A solution of 70 parts of stabilizer-free acrylic acid and 0.1 part of azodiisobutyronitrile in 200 parts by volume of benzene is dripped in in the course of 3 hours. Reflux conditions are maintained for a further hour while stirring. The precipitated copolymer is filtered off and dried at 60°C. 50 parts of the copolymer are dispersed in 200 parts by volume of 1,4-butanediol monoacrylate and stirred at 30°C for 7 hours until completely dissolved. The polymer is then precipitated by pouring the solution into 1000 parts by volume of cyclohexane, then filtered off and dried in a vacuum dryer at 30°C.

20 parts of the N-vinylpyrrolidone/vinyl acetate copolymer prepared according to Example 2 are stirred in 200 parts of a mixture of acrylic acid, acrylic anhydride, pyridine and hydroquinone (volumetric ratio 1 : 1 : 0.1 : 0.1) until completely dissolved. The copolymer obtained is precipitated by pouring the solution into cyclohexane, filtered off and dried.

8 parts of the copolymer thus obtained from acrylic acid and the 1,4-butanediol monoacrylate half-ester of maleic acid are dissolved in 100 parts by volume of dimethyl formamide, following which 6 parts of 1,1,1-trimethylolpropane triacrylate, 0.5 part of α-methylolbenzoinmethyl ether, 0.01 part of hydroquinone and 0.01 part of the disodium salt of 2,5-indigodisulfonic acid are added. To this solution there is added a clear solution of 10 parts of the N-vinylpyrrolidone copolymer in 200 parts by volume of dimethyl formamide. An aluminum plate which has been etched in a 30% by weight aqueous sodium hydroxide solution for 10 seconds to improve adhesion is coated with the solution by immersion therein and slow withdrawal (at 1 cm/min) at room temperature. In this way a film thickness of 0.0015 mm is obtained. The plate is then heated in a drying cabinet at 115°C for 15 minutes.

The plate is exposed for 2 minutes through a halftone negative in a conventional offset exposure unit to produce a planographic printing plate on which the image is clearly visible due to decolorization of the indigo dye in the exposed areas. This printing plate can produce in a small offset press 100,000 impressions of uniformly excellent quality.

We claim:
1. A process for the production of printing plates using a photosensitive composition consisting essentially of an intimate blend of
   A. 40 to 97% by weight, with reference to the whole blend A + B, of a mixture of
      A.1. 15 to 80% by weight, with reference to A, of a water-soluble linear N-vinylpyrrolidone polymer having a molecular weight of at least 1000, and
      A.2. 20 to 85% by weight, with reference to A, of a polymer or copolymer of an olefinically unsaturated carboxylic acid having 3–6 carbon atoms which is soluble or swellable in water or aqueous alkali and has a molecular weight of at least 500, the content of carboxyl groups therein being at least 5% by weight based on the polymeric polycarboxylic acid, and
   B. 3 to 60% by weight, with reference to the whole blend A + B, of olefinically unsaturated monomers which are compatible with mixture A (A.1 + A.2), which do not boil below 100°C at atmospheric pressure, and of which the portion having more than one photo polymerizable olefinically unsaturated double bond predominates, which comprises applying a thin layer of said composition to supports and exposing said layer through an at least partially transparent negative or positive without subsequent development processing.

2. A process for the production of printing plates as claimed in claim 1, wherein the printing plates are dried for a short period at from 60° to 130°C before exposure.

3. A process for the production of printing plates as in claim 1 wherein said photosensitive composition contains from 0.01 to 20% by weight, based on the whole blend A + B, of a photoinitiator.

4. A process for the production of printing plates as in claim 1 wherein said photosensitive composition contains from 0.01 to 1% by weight, based on the whole blend A + B of a polymerization inhibitor.

* * * * *